United States Patent
Soung et al.

[11] Patent Number: 5,842,917
[45] Date of Patent: Dec. 1, 1998

[54] AUTOMATED MANUFACTURING PLANT FOR SEMICONDUCTOR DEVICES

[75] Inventors: B. M. Soung; I. I. Chen, both of Hsin-Chu, Taiwan

[73] Assignee: United Microelectronics Corproration, Taiwan

[21] Appl. No.: 786,051

[22] Filed: Jan. 10, 1997

Related U.S. Application Data

[60] Provisional application No. 60/009,733 Jan. 11, 1996.
[51] Int. Cl. [6] ................................................... F24F 7/007
[52] U.S. Cl. .......................................................... 454/187
[58] Field of Search .......................... 454/187; 55/385.2; 414/231, 235, 243, 783, 935, 939, 940, 941

[56] References Cited

U.S. PATENT DOCUMENTS

| | | | |
|---|---|---|---|
| 4,923,352 | 5/1990 | Tamura et al. | 454/251 X |
| 5,058,491 | 10/1991 | Wiemer et al. | 454/187 |
| 5,096,477 | 3/1992 | Shinoda et al. | 454/187 X |
| 5,139,459 | 8/1992 | Takahashi et al. | 454/187 |
| 5,350,336 | 9/1994 | Chen et al. | 454/187 |
| 5,429,642 | 7/1995 | Ohkuma | 29/25.01 |
| 5,431,599 | 7/1995 | Genco | 454/187 |
| 5,668,056 | 9/1997 | Wu et al. | 438/106 |

FOREIGN PATENT DOCUMENTS 5-205988  8/1993  Japan ..................................... 454/187

*Primary Examiner*—Harold Joyce
*Attorney, Agent, or Firm*—Rabin & Champagne, P.C.

[57] ABSTRACT

Operator-related contamination in a semiconductor manufacturing plant is reduced by eliminating operator presence in most of the processing areas of a semiconductor manufacturing plant. To facilitate the reduction of operator presence, the fabrication facility is divided into two physically separate areas. Operators are present in an inspection and testing area within the fabrication facility, and the processing equipment which is best used manually is located within this area. Processing equipment which does not require manual operation or monitoring and which performs particularly sensitive processing operations is located in one or more processing areas physically separated from the areas in which operators are present. Semiconductor wafer transport, processing and process monitoring within the processing areas is completely automated. Reduced volumes can be obtained for these processing chambers, allowing higher levels of cleanliness to be obtained in the sensitive processing areas. Preferably, semiconductor wafers undergoing processing are passed between the operator area and the processing areas through chambers which act as buffers between the relatively cleaner processing environment and the relatively more contaminated operator environment. The buffers may have dedicated air filtration and circulation or other means for limiting the passage of contaminants from the operator area to the processing areas.

11 Claims, 6 Drawing Sheets

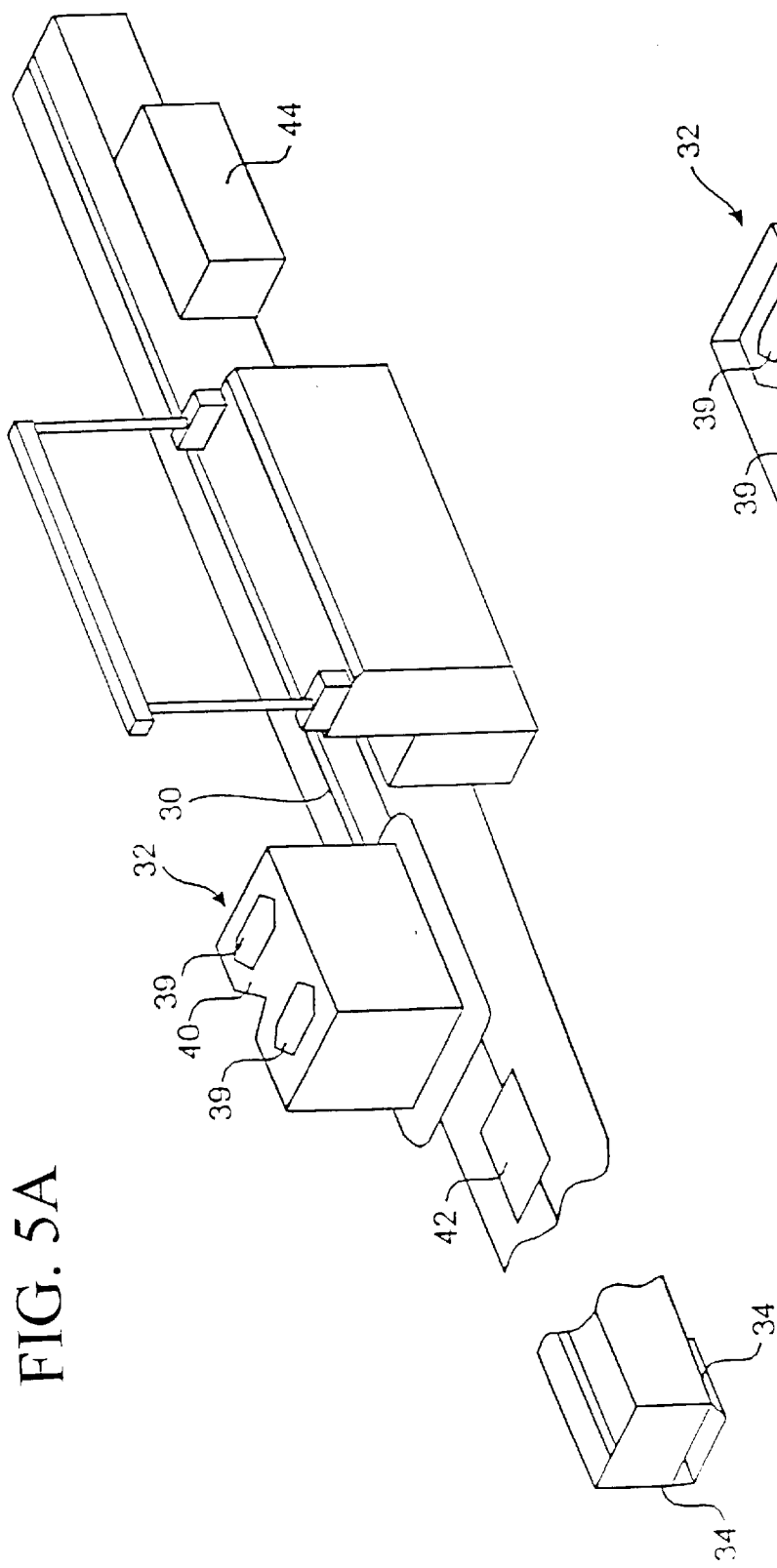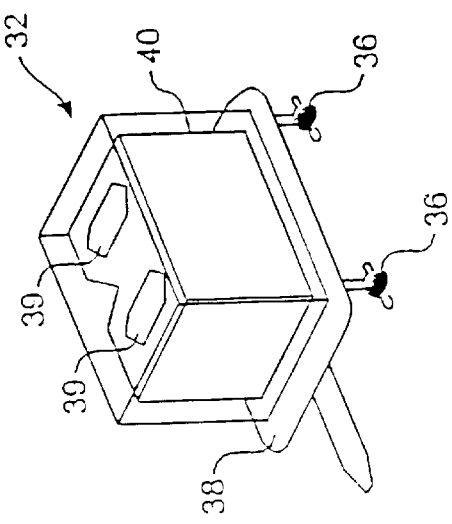
FIG. 5A
FIG 5B

AUTOMATED MANUFACTURING PLANT FOR SEMICONDUCTOR DEVICES

This application claims priority from provisional application Ser. No. 60/009,733, filed Jan. 11, 1996.

BACKGROUND OF THE INVENTION

1. Field of the Invention

The invention relates to improved semiconductor manufacturing plants and more particularly to manufacturing plants having an improved arrangement for confining operator contamination to only the specific areas which require the presence of human operators.

2. Description of the Related Art

In the manufacture of semiconductor devices having small feature sizes, contamination of the semiconductor surface by minute dust particles deposited from the air can reduce the quality of the resulting semiconductor devices, reducing the yield of semiconductor devices. Semiconductor device manufacturing plants have long used clean and ultra clean rooms where air is constantly circulated and filtered to reduce the possibility of contamination, but the continued presence of human operators within the manufacturing environment acts as a serious source of contamination. For example, particles of dead skin flake from the human body constantly, and much of this skin particulate is sufficiently small to become airborne. Such skin particulate may subsequently adhere to various materials and films deposited on the semiconductor substrates during manufacture, thereby impairing material deposition, pattern formation, and causing other production errors which result in a variety of flaws in the semiconductor devices. The skin particle problem can be reduced by utilizing clothing designed to contain the contamination, but some areas of the operator's skin are not covered to enhance the efficiency of the operator, i.e., the facial areas. Also, the contamination is not always contained by the clothing and may work its way out. While most of this contamination will eventually be filtered out by the clean air system, some may find its way onto the semiconductor devices being processed and do serious harm. Efforts have been made to totally eliminate human beings from the manufacturing area. However, the semiconductor manufacturing process requires process monitoring including the taking of measurements most efficiently taken manually, which requires the continued presence of operators in the manufacturing environment.

SUMMARY OF THE PREFERRED EMBODIMENTS

It is an object of the invention to provide a new semiconductor manufacturing plant wherein potential human contamination is more limited than in conventional manufacturing plants.

It is another object of the invention to provide an automated semiconductor manufacturing plant wherein manufacturing processes that do not require human intervention are separated from processes that require human manipulation, and the operations that do not require human intervention are performed in a cleaner environment.

In accordance with the aforementioned objects there is provided a new semiconductor manufacturing clean room plant in which potential human operator contamination is confined to areas requiring manual operations. The plant has a containment building, an elongated enclosed operator inspection and testing chamber having peripheral walls, and a plurality of tunnels extending away from the testing chamber. The testing chamber has pass-through openings in the peripheral walls that communicate with the tunnels. A means is provided to maintain a clean environment in both the inspection and testing chamber and in each of the tunnels. Processing equipment for manufacturing semiconductor devices is provided in or is accessible from the inside of the tunnels. An automated transfer means moves semiconductor wafers from the pass-through openings to and from processing equipment in the tunnels. In the chamber, measuring and testing equipment are arranged serially in the center area. Operator aisles are provided on opposite sides of the measurement and testing equipment. A material handling system is provided to accept and deliver wafers from the pass-through openings to other of the pass-through openings and also to the testing and measuring equipment in the testing chamber. A central computer controls and coordinates the operations of the manufacturing equipment, the automated transfer means, and the material handling system.

In accordance with a different embodiment of the present invention, a manufacturing plant comprises a first processing area containing or communicating with one or more pieces of processing equipment. The first processing area is coupled to first means for providing clean air. A second processing area is physically separate from the first processing area and is adapted to accommodate human operators within the second processing area. The second processing area is coupled to second means for providing clean air. One or more buffers is provided for transferring work pieces between the first processing area and the second processing area. The one or more buffers comprising a third means for providing clean air.

BRIEF DESCRIPTION IF THE DRAWINGS

FIG. 5A is a perspective view of a preferred embodiment of a carrier and track used in the automated transfer means.

FIG. 5B is a perspective view of the wheeled carrier.

DETAILED DESCRIPTION OF PREFERRED EMBODIMENTS

Preferred embodiments of the present invention limit the possibility of operator-related contamination in a semiconductor manufacturing environment by reducing, or most preferably eliminating, operator presence in most of the processing areas of the plant. To facilitate the reduction of operator presence, the fabrication facility may be divided into two physically separate areas. Operators are present in an inspection and testing area within the fabrication facility, and the processing equipment which is best used manually is located within this area. Preferably, a single operator area is centrally located in the fabrication facility, but other configurations having multiple operator areas or peripherally located operator areas are also possible, if the configurations limit operator contamination adequately. Processing equipment which does not require manual operation or monitoring and which performs particularly sensitive processing operations is located in one or more processing areas physically separated from the areas in which operators are present. Semiconductor wafer transport, processing and process monitoring within the processing areas is completely automated. Because only automated wafer transport and processing is performed within the processing chambers, less space needs to be provided in the processing areas. Reduced volumes can be obtained for these processing chambers, allowing higher levels of cleanliness to be obtained in the sensitive processing areas. Preferably, semiconductor wafers undergoing processing are passed between the operator area and the processing areas through chambers which act as buffers between the relatively cleaner processing environment and the relatively more contaminated operator environment. The buffers may have dedicated air filtration and circulation or other means for limiting the passage of contaminants from the operator area to the processing areas.

Figure 1:
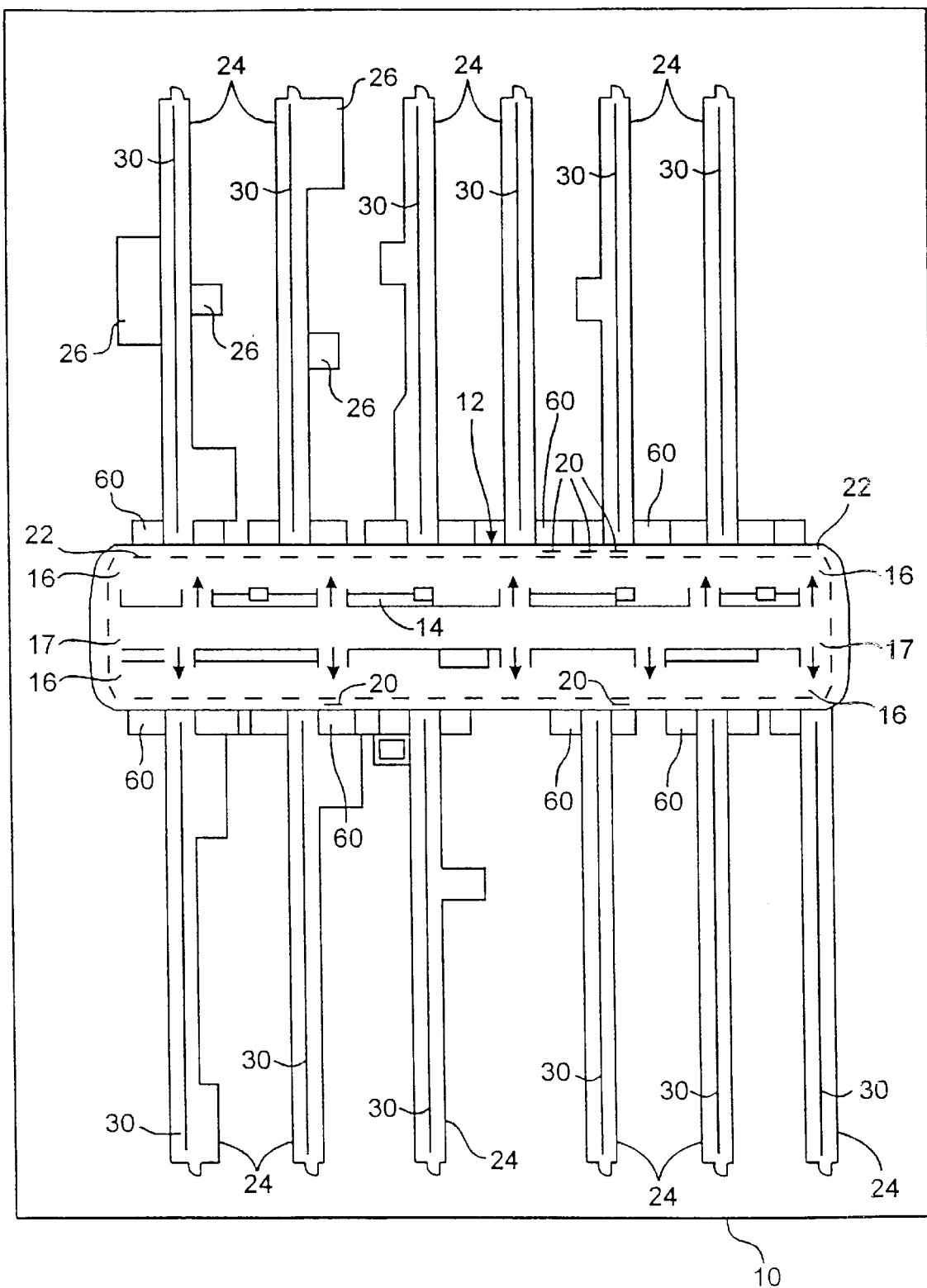
FIG. 1 is a top plan view of the manufacturing plant of the invention.

Preferred embodiments of a manufacturing plant in accordance with present invention are illustrated in the figures. FIG. 1 shows an overall view including a containment building 10 that houses the components of the plant. The plant preferably has an elongated and enclosed operator inspection and testing chamber 12 centrally located and provided with a means to maintain a clean environment within the chamber. A clean environment is established and maintained within chamber 12 with conventional air circulation and filtration mechanisms well known in the art. Suitable air circulation and air filtration apparatus for chamber 12 are described in, for example, U.S. Pat. No. 5,350,336, hereby incorporated by reference. Various degrees of cleanliness can be established and maintained in different sections of the fabrication facility through the selection and use of appropriate types of filters. While it is desirable to maintain high levels of cleanliness throughout the fabrication facility, the requirements for maintaining high levels of cleanliness in the operator chamber 12 might be relaxed in fabrication facilities in accordance with preferred embodiments of the present invention. This is because the more sensitive processing steps are primarily performed within the physically separate processing areas. Alternately, and more preferably, high levels of cleanliness can be maintained within operator chamber 12, and still higher levels of cleanliness can be obtained within the processing areas.

Figure 2:
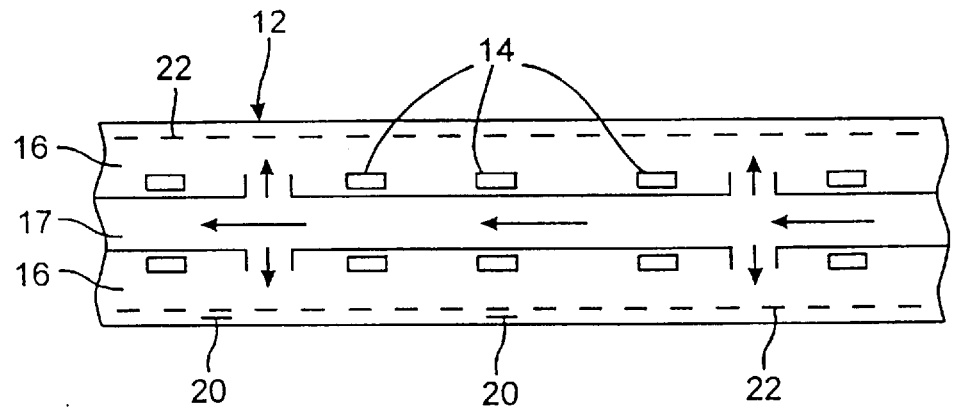
FIG. 2 is a top plan view, in broken section, of a first embodiment of the equipment arrangement in the testing and measuring chamber.
Figure 3:
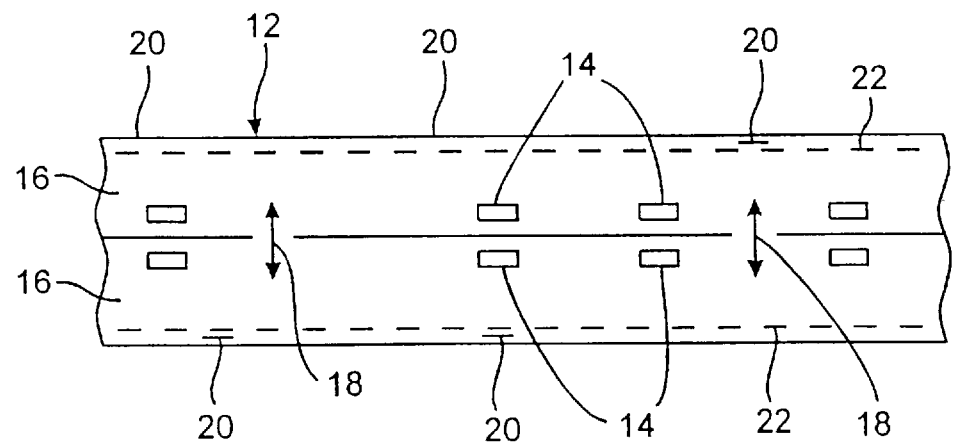
FIG. 3 is a top plan view, in broken section, of a second embodiment of equipment arrangement in the testing and measuring chamber.
Figure 4:
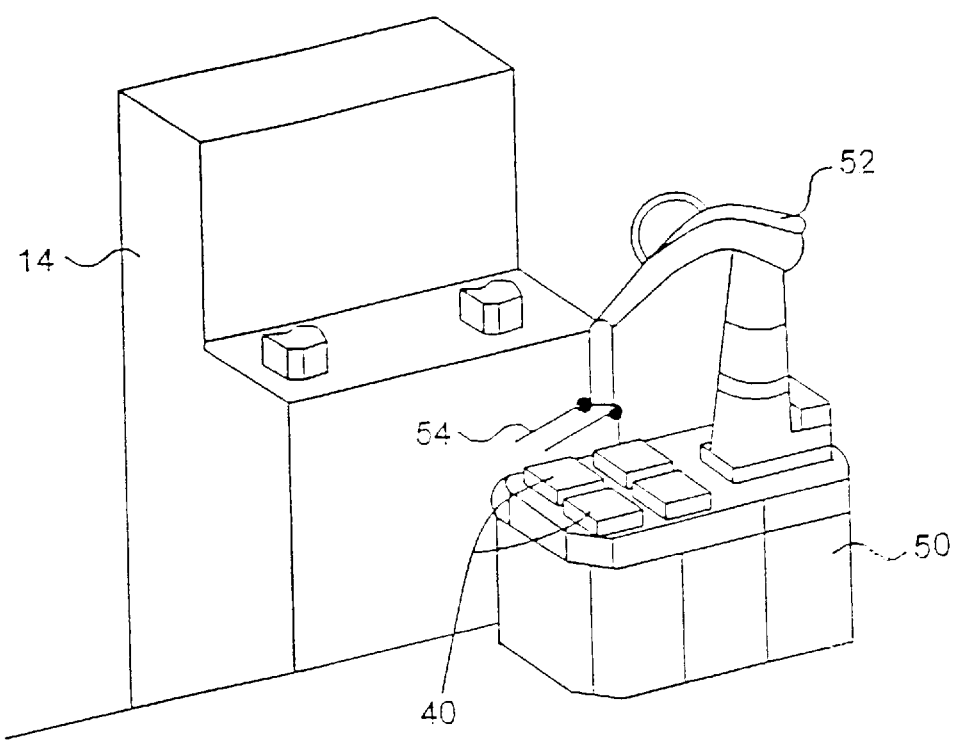
FIG. 4 is a perspective view of a preferred specific embodiment of the material handling system used to move product in the inspection and testing chamber.

In the configuration illustrated in FIG. 1, the testing and inspection apparatus 14 are arranged in two spaced rows with operator aisles 16 on the outside of chamber 12 and an aisle 17 in the center of the chamber. The apparatus 14 housed in chamber 12 are of the type that normally require manual operation including, for example, film thickness measurement tools, CD measurement apparatus, particle counters, various types of inspection apparatus, such as AEI and ADI, resistance measurement apparatus and the like. FIGS. 2 and 3 depict two specific arrangements of the apparatus 14 within chamber 12. In FIG. 2, the apparatus 14 are arranged in spaced rows within the two aisles 16 so that the operators face inwardly when operating the apparatus 14. Center aisle 17 is provided for use by non-operator personnel, such as supervisors, maintenance personnel, etc. In some embodiments of the present invention, center aisle 17 may be separated from the inspection and testing area of aisles 16 by walls having appropriate viewing windows to isolate the personnel within aisle 17 from the inspection and testing area. In the alternate configuration of the operator area illustrated in FIG. 3, the apparatus 14 are also arranged in two rows to provide operator aisles 16. However, no center aisle is provided in the FIG. 3 configuration. Walk-through openings 18 are provided at suitable intervals to allow passage of personnel from one of the aisles 16 to the opposite aisle 16. The arrangement shown in FIG. 2 allows unimpeded passage of non-operator personnel through the chamber, provides vantage observation areas, and may reduce the potential for contamination since the configuration further reduces the number of personnel within the fabrication area. However, the FIG. 2 configuration requires additional floor area as compared to the FIG. 3 configuration.

Operator chamber 12 is provided with openings 20 in the peripheral wall for moving semiconductor wafers and devices into and out of the chamber. An annular vehicle track 22 shown as a dotted line, encircles the chamber 12 and is located behind the operators of apparatus 14 and adjacent the openings 20. Wafer carrying robots moving along the vehicle track 22 provide automated wafer transport between testing stations within the inspection and testing chamber 12, or between a testing station and an opening 20 to allow the wafers to be automatically passed from a testing station out from the operator chamber 12 to a further stage in device processing. Here, as is preferred throughout the fabrication facility, it is preferred that wafers are transported in wafer cassettes or other packaging adapted to carry multiple wafers and adapted for use with automated wafer handling equipment. Automated wafer handling reduces the possibility of operator error damaging a wafer during processing.

The wafer handling system preferably has one or more automatic guided vehicles 50 that travel about chamber 12 along the vehicle track 22, preferably traveling adjacent the peripheral wall of the operator chamber, as shown in FIG. 1. Preferred embodiments of the present invention utilize a guided vehicle 50 which has wheels (not shown) and a guidance system that controls its movement about chamber 12. A particularly preferred embodiment of a guided vehicle 50 that is commercially available from Muratec is shown in greater detail in FIG. 7. A flat top surface provides a space to store and convey several cassettes 40 containing wafers to be processed and tested. A robotic apparatus 52, with a cassette gripping mechanism 54, is mounted on vehicle 50. Robotic apparatus is provided to transfer cassettes 40 to and from testing apparatus 14, and also to and from openings 20 to tunnels 24. Various refinements can be provided for the robotic apparatus 52, such as CCD cameras on the robot arm to confirm the relative positions of the cassettes and gripping mechanism 54.

As shown in FIG. 1, a plurality of processing tunnels 24 are positioned to extend outwardly from chamber 12. Tunnels 24 communicate with the operator chamber 12 through openings 20 so that wafers can be passed between operator chamber 12 and the tunnels 24. Manufacturing equipment 26 is located within or is accessible from within the tunnels 24 for the processing and manufacture of semiconductor devices. Some types of manufacturing equipment are located entirely within the processing tunnels 24, while other types of manufacturing equipment are normally located outside of the tunnels and instead have an interface with the tunnel. The advantage of this arrangement is that maintenance work can be performed on the manufacturing equipment from areas outside of the clean environment of the processing tunnel, and less clean air volume is required within the processing tunnels 24. A suitable means is provided to maintain a clean environment in the tunnels 24. Air circulation and filtration equipment for maintaining a clean environment within the tunnels 24 are described, for example, in U.S. Pat. No. 5,350,336, incorporated herein by reference. Desirably, the level of filtration maintained in the tunnels 24 is higher than that maintained in the operator chamber 12.

Each of the tunnels 24 is provided with an automated transfer means to temporarily store and to move semiconductor wafers into the tunnels, within the tunnels and to the various manufacturing equipment stations 26, between the various manufacturing stations, and out of the tunnels after the completion of a particular processing step or steps on the semiconductor wafers. The automated transfer means includes a linear track 30 and a transport vehicle 32 designed to move on the track 30. A preferred specific embodiment of an automated transport means is shown in FIG. 5A. The illustrated track and vehicle are commercially available from, for example, Muratec. The linear track 30 has spaced rails 34 that support the wheels 36 of vehicle 32, shown in more detail in FIG. 5B. Vehicle 32 has a platform 38 which supports product wafers, normally enclosed in one or more cassettes 40. The track 30 is provided with linear induction motors 42 on the track that interact with suitable elements on vehicle 32 to move the vehicle along the track 30. A clean fan box 44 assists in maintaining a clean environment (e.g., class 1) along the tracks and in the tunnel. Suitable robotic apparatus (not shown) are positioned at each of the manufacturing apparatus 26 to transfer the cassettes 40, containing wafers 39, to an interface of apparatus 26 which interface, in turn, provides the wafers to apparatus 26 for processing. After processing, the wafer cassette 40 is reloaded and returned to the vehicle 32 for transport to further stations.

Figure 6:
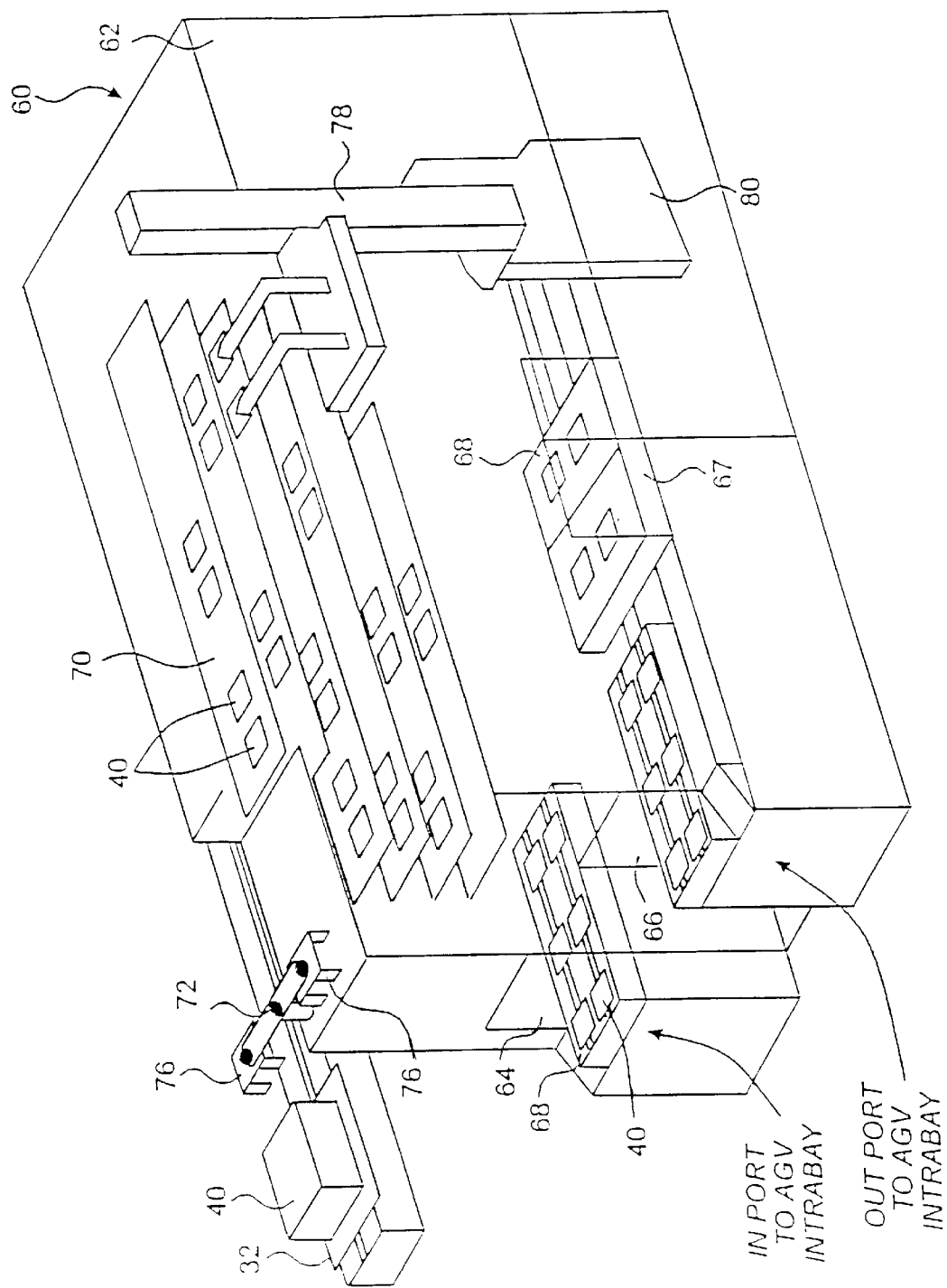
FIG. 6 is a perspective view of a preferred embodiment of a product buffer system used in the automated transfer means.
Figure 7:
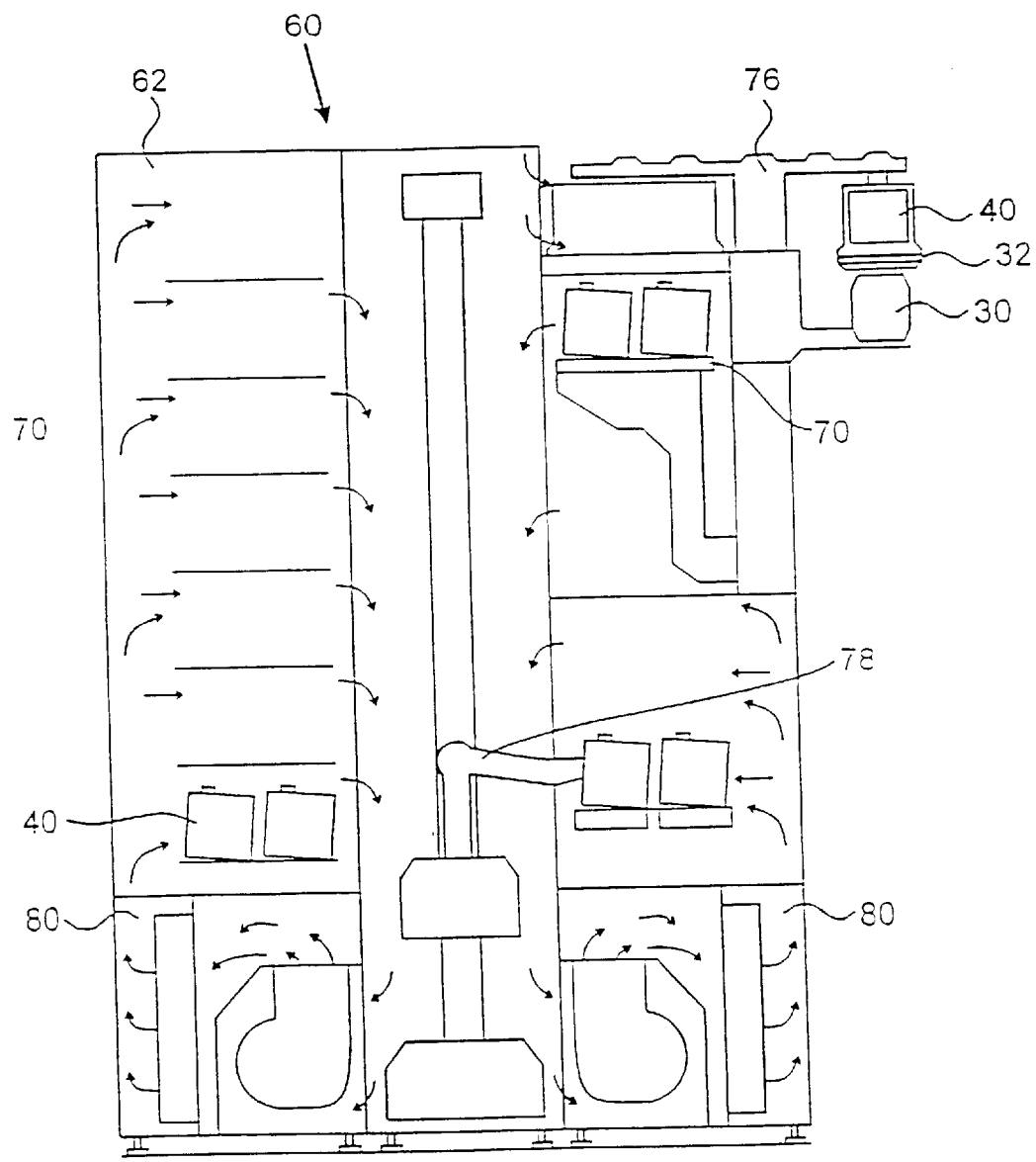
FIG. 7 is another view of a preferred buffer system used in the automated transfer means.

Storage buffers may be positioned in the side aisles 16 of the operator chamber 12. The storage buffers are preferably associated with the openings 20 in the peripheral wall of the operator chamber 12 and accept cassettes from the guided vehicles 50 of the wafer transport system within the operator chamber 12 as well as cassettes of wafers provided from the tunnels 24 after completion of the processing steps performed in the particular tunnel. The storage buffers can store the cassettes for any desired time prior to delivering the wafers to the manufacturing equipment 26, and the storage buffers can store the cassettes after the wafers in the cassette have been processed by equipment 26. A preferred specific embodiment of a buffer unit 60 is shown in FIGS. 6 and 7. Here again, the illustrated buffer is a Muratec product and is typically available to the those of ordinary skill. The buffer 60 has its own housing 62 and may typically have five openings, previously illustrated collectively as openings 20, opening for receiving and delivering cassettes to vehicle 32 within the tunnel 24. An opening 64 is provided for receiving cassettes from the automatic guided vehicle 50 in chamber 12 and an opening 66 is provided for delivering cassettes to the vehicle 50 in chamber 12. The storage buffer also includes an opening 67 for manual delivery of cassettes from the chamber 12, and an opening 64 for manual reception of cassettes to chamber 12. Within the housing 62 of the storage buffer, a platform 68 is provided for temporarily holding cassettes 40 until they can be removed and either delivered to vehicle 32 or stored on shelves 70 by rotary transfer machines 72 and 74. Transfer machines 72 and 74 are provided with suitable gripping mechanisms 76 so that the transfer machines can remove cassettes from or provide cassettes to the transport vehicle of an automated transfer means (shown in FIGS. 5A and 5B). A stacker robot 78 is also provided in housing 67 to transfer cassettes 40 to different locations within the buffer 60.

FIG. 7 depicts an end view of buffer 60. The relative positions of the shelves 70, and stacker robot 78 are shown from a different perspective. An air circulation and filtration system 80 is provided in each of the buffers. The filtration system 80 represents a particularly preferred feature of the buffers to be used in the present invention. The buffers 60 separate the operator chamber 12, which may be prone to contamination due to the presence of operators from the processing tunnels 24 which are preferably kept very clean. By providing a high capacity and highly clean filtration system in the buffer 60 between the operator chamber 12 and the tunnels 24, any contamination which might be present in the operator chamber can be prevented from reaching the processing chambers.

The various operations of the buffer, the manufacturing equipment in the tunnels, the automated transport vehicles, and the interface equipment necessary to transfer cassettes from the vehicle to the manufacturing equipment in the tunnel, keeping track of the wafer processing operations performed on each wafer, and any other automated apparatus are controlled by a central computer. Careful control of the transport, storage and processing of each of the wafers is particularly important to the effective automation of preferred embodiments of a manufacturing plant in accordance with the present invention.

While the invention has been particularly shown and described with reference to the preferred embodiments thereof, it will be understood by those skilled in the art that various changes in form and details may be made without departing from the spirit and scope of the invention.

What is claimed is:

1. A manufacturing plant for semiconductor wafers in which potential human operator contamination is confined to areas with equipment requiring manual operation, the manufacturing plant comprising:

a containment building;

an enclosed operator chamber within the containment building having peripheral walls, a plurality of openings in the peripheral walls, and a means to maintain a clean environment in the operator chamber;

a plurality of tunnels arranged about the operator chamber, wherein each of the tunnels communicates with the chamber through at least one of the openings;

means for maintaining a clean environment in the tunnels, the environment in the tunnels being maintained cleaner than the environment in the operator chamber;

processing equipment within or accessible from the tunnels;

automated transfer means within the tunnels to move wafers from the openings to and from the processing equipment;

measurement and testing equipment in the operator chamber;

a material handling system within the operator chamber to accept from and deliver wafers to the automated transfer means through the openings, and also to accept from and deliver wafers to the measurement and testing equipment; and a computer system to control and coordinate the operation of the manufacturing equipment, the automated transfer means, and the automated material handling system.

2. The manufacturing plant of claim 1 wherein the semiconductor wafers are enclosed within cassettes for transport.

3. The manufacturing plant of claim 2 wherein the operator chamber includes a vehicle track adjacent the peripheral walls.

4. The manufacturing plant of claim 3 wherein the material handling system has at least one automated guided vehicle that moves on the vehicle track.

5. The manufacturing plant of claim 4 wherein the at least one automatic guided vehicle has a material handling robot adapted to transfer cassettes to and from the vehicle.

6. The manufacturing plant of claim 2, wherein the automatic transfer means includes storage buffers for storing cassettes, the storage buffers located within the tunnels adjacent the openings.

7. The manufacturing plant of claim 6 wherein each of the storage buffers are provided with a plurality of shelves adapted to temporarily store cassettes.

8. The manufacturing plant of claim 7, wherein each of the storage buffers are provided with a first rotary transfer robot that transfers cassettes from the automated transfer means to the storage buffer, and a second rotary transfer robot that transfers cassettes from the storage buffer to the automatic material handling system.

9. The manufacturing plant of claim 8 wherein each of the storage buffers include a stacker robot capable of moving cassettes within the storage buffer.

10. The manufacturing plant of claim 8 wherein the automated transfer means includes a linear track within at least one of the tunnels, a transport vehicle mounted for movement on the linear track, a series of linear motors on the linear track that interact with the transport vehicle to move the vehicle between the storage buffer and the manufacturing equipment in, or accessible from, the tunnel.

11. The manufacturing plant of claim 1 wherein the measurement and testing equipment is arranged in separate rows in the tunnel leaving a center aisle between the rows.

\* \* \* \* \*